United States Patent
Azdasht et al.

(10) Patent No.: US 10,354,971 B2
(45) Date of Patent: Jul. 16, 2019

(54) METHOD FOR PRODUCING A CHIP MODULE

(71) Applicant: Pac Tech—Packaging Technologies GmbH, Nauen (DE)

(72) Inventors: Ghassem Azdasht, Berlin (DE); Thorsten Teutsch, Santa Cruz, CA (US); Ricardo Geelhaar, Berlin (DE)

(73) Assignee: PAC TECH—PACKAGING TECHNOLOGIES GMBH, Nauen (DE)

( * ) Notice: Subject to any disclaimer, the term of this patent is extended or adjusted under 35 U.S.C. 154(b) by 0 days.

(21) Appl. No.: 15/106,605

(22) PCT Filed: Nov. 25, 2014

(86) PCT No.: PCT/EP2014/075518
§ 371 (c)(1),
(2) Date: Jan. 25, 2017

(87) PCT Pub. No.: WO2015/096946
PCT Pub. Date: Jul. 2, 2015

(65) Prior Publication Data
US 2017/0133340 A1   May 11, 2017

(30) Foreign Application Priority Data
Dec. 27, 2013   (DE) .......... 10 2013 114 907

(51) Int. Cl.
*H01L 23/31* (2006.01)
*H01L 23/00* (2006.01)
(Continued)

(52) U.S. Cl.
CPC .......... *H01L 24/27* (2013.01); *H01L 21/4832* (2013.01); *H01L 23/49562* (2013.01);
(Continued)

(58) Field of Classification Search
CPC ..... H01L 2224/73265; H01L 2924/181; H01L 2924/1306; H01L 2224/16225;
(Continued)

(56) References Cited

U.S. PATENT DOCUMENTS

| 5,497,033 A | 3/1996 | Fillion et al. |
| 8,008,125 B2 | 8/2011 | McConnelee et al. |

(Continued)

FOREIGN PATENT DOCUMENTS

| DE | 10 2011 003852 | 8/2012 |
| EP | 1848030 A2 | 10/2007 |

(Continued)

OTHER PUBLICATIONS

PCT English Language Translation of the International Preliminary Report on Patentability, PCT/EP2014/075518, dated Jul. 7, 2016.
(Continued)

*Primary Examiner* — Bradley Smith
*Assistant Examiner* — David J Goodwin
(74) *Attorney, Agent, or Firm* — Quarles & Brady LLP

(57) ABSTRACT

The invention concerns a method for producing a chip module having a carrier substrate and at least one chip arranged on the carrier substrate, as well as a contact conductor arrangement for connecting chip pads to contacts arranged on a contact face of the chip module, in which method the front face of the chip which is provided with the chip pads is secured to the carrier substrate and then the contact conductor arrangement is formed by structuring of a contact material layer of the carrier substrate.

13 Claims, 6 Drawing Sheets

(51) Int. Cl.
  *H01L 21/48* (2006.01)
  *H01L 23/538* (2006.01)
  *H01L 23/495* (2006.01)
  *H01L 23/498* (2006.01)

(52) U.S. Cl.
  CPC .... *H01L 23/49816* (2013.01); *H01L 23/5384* (2013.01); *H01L 23/5389* (2013.01); *H01L 24/11* (2013.01); *H01L 24/24* (2013.01); *H01L 24/25* (2013.01); *H01L 24/29* (2013.01); *H01L 24/32* (2013.01); *H01L 24/82* (2013.01); *H01L 24/96* (2013.01); *H01L 2224/04105* (2013.01); *H01L 2224/06181* (2013.01); *H01L 2224/12105* (2013.01); *H01L 2224/13022* (2013.01); *H01L 2224/16245* (2013.01); *H01L 2224/24137* (2013.01); *H01L 2224/2518* (2013.01); *H01L 2224/32245* (2013.01); *H01L 2224/73204* (2013.01); *H01L 2224/73253* (2013.01); *H01L 2224/73259* (2013.01); *H01L 2224/73267* (2013.01); *H01L 2224/81224* (2013.01); *H01L 2224/81903* (2013.01); *H01L 2224/82005* (2013.01); *H01L 2224/82039* (2013.01); *H01L 2224/83192* (2013.01); *H01L 2224/92144* (2013.01); *H01L 2224/92224* (2013.01)

(58) Field of Classification Search
  CPC ....... H01L 23/5389; H01L 2224/04105; H01L 2224/12105; H01L 24/19; H01L 2224/97; H01L 2924/15311
  See application file for complete search history.

(56) References Cited

U.S. PATENT DOCUMENTS

| 9,564,413 B2* | 2/2017 | Han | H01L 31/02005 |
| 2009/0194882 A1 | 8/2009 | Mahler et al. | |
| 2011/0204494 A1* | 8/2011 | Chi | H01L 21/56 |
| | | | 257/659 |
| 2013/0249106 A1* | 9/2013 | Lin | H01L 24/19 |
| | | | 257/774 |
| 2013/0270230 A1* | 10/2013 | Cheung | H01L 24/75 |
| | | | 219/121.6 |

FOREIGN PATENT DOCUMENTS

| JP | 07 321444 | 12/1995 |
| KR | 101 253 514 | 4/2013 |
| WO | 2009/037145 | 3/2009 |

OTHER PUBLICATIONS

International Search Report dated Oct. 6, 2015 for International Application No. PCT/EP2014/075518.
European Patent Office, Search Report, Application No. EP 17151929, dated Nov. 29, 2017, 3 pages.

* cited by examiner

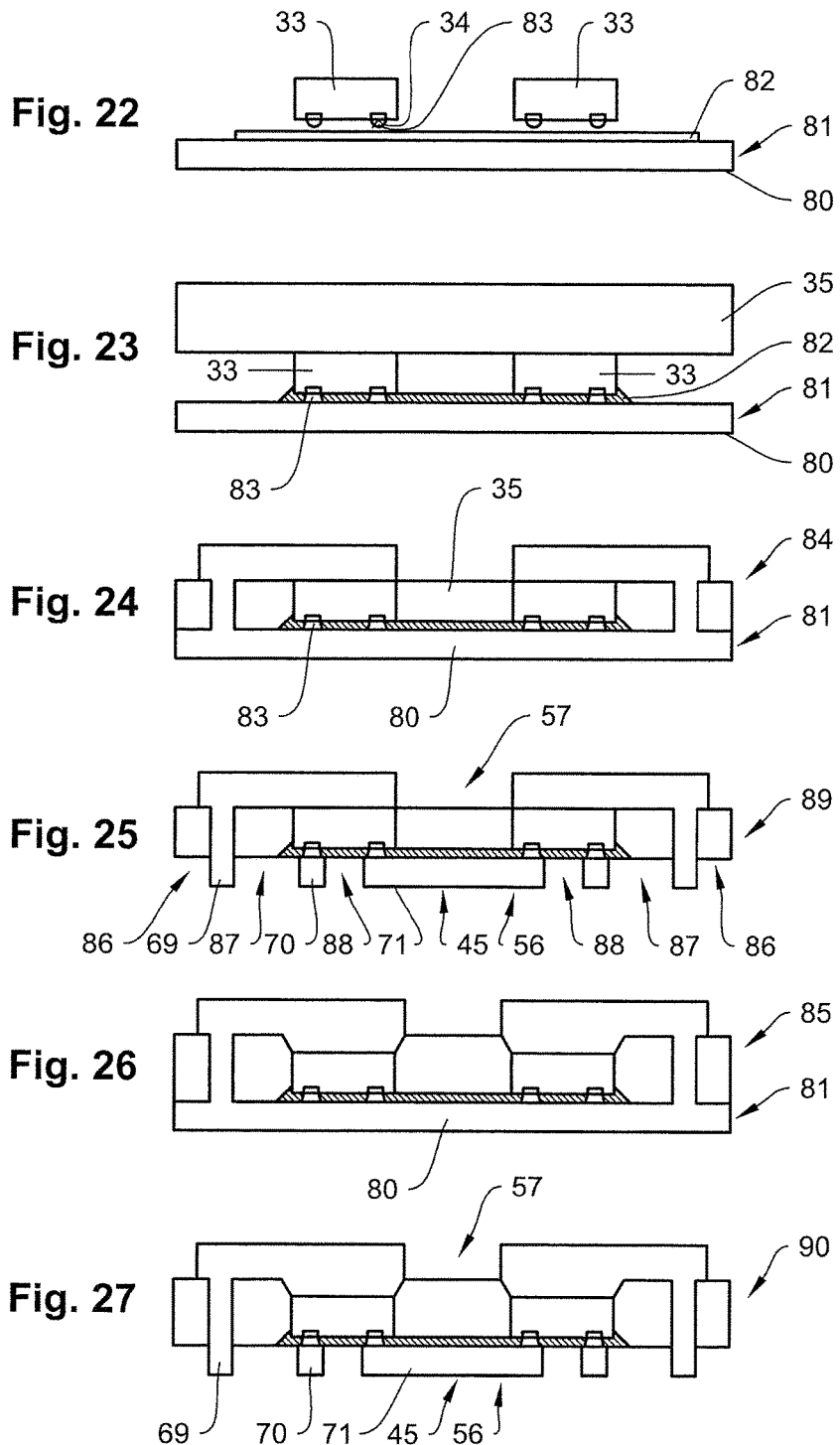

METHOD FOR PRODUCING A CHIP MODULE

CROSS-REFERENCE TO RELATED APPLICATIONS

This application represents the national stage entry of PCT International Application No. PCT/EP2014/075518 filed Nov. 25, 2014 and claims priority to German Patent Application No. 10 2013 114 907.3 filed Dec. 27, 2013. The contents of this application are hereby incorporated by reference as if set forth in their entirety herein.

The invention at hand relates to a method for producing a chip module having a carrier substrate and at least one chip arranged on the carrier substrate as well as a contact conductor arrangement for connecting chip terminal faces with terminal contacts arranged on a contact side of the chip module, in which method the chip is secured on the carrier substrate with its front side provided with the chip terminal faces, and subsequently the forming of the contact conductor arrangement is effected by means of a structuring of a contact material layer of the carrier substrate.

Chip modules, which are commonly referred to as "chip packages" in technical terminology, principally feature a carrier substrate provided with a contact conductor arrangement and a chip which is protectively accommodated in a chip housing and is contacted with the contact conductor arrangement via its chip terminal faces. The task of the contact conductor arrangement is essentially to provide a suitable arrangement of terminal contacts for the outer contacting of the chip module whereas the terminal contacts have a larger spacing from each other than the chip terminal faces as well as larger contact surfaces in order to simplify the outer contacting of the chip module.

In particular, adjustments to terminal contact arrangements of further chip modules or circuit boards can be made by means of the contact conductor arrangement, such that the chip module can be contacted with the further chip module or circuit board with no additional rewiring. Therefore, the contact conductor arrangement can be viewed as an integrated "rewiring" of the chip module which makes an external rewiring between chip modules which are to be contacted redundant. The special layout or the special distribution of the outer terminal contacts which individualizes the chip module is also commonly referred to as a so-called "footprint".

Known methods for producing a chip module include, for example, using a substrate made of a dielectric material as a chip carrier, said substrate being provided with a contact conductor arrangement for forming the "internal rewiring", wherein after the production of the contact conductor arrangement the contacting of the chip on the chip carrier and subsequently the forming of a chip housing accommodating the chip on the chip carrier is effected by the chip being encased by a so-called "mold" which is applied on the chip in liquid form and provides the required protective housing for the chip after hardening.

The object of the invention at hand is to propose a method that considerably facilitates the production of a chip module and in particular allows an industrial production of chip modules in large quantities with little cost.

In the inventive method, the chip is secured with its front side provided with chip terminal faces to a contact material layer of a carrier substrate. After the securing of the chip for placement on the carrier substrate, the forming of the contact conductor arrangement is effected by means of structuring the contact material of the carrier substrate. This makes the provision of chip carriers that are already provided with a contact conductor arrangement redundant. In fact, the forming of the contact conductor arrangement can be effected with a footprint which individualizes the chip module together with the production of the chip module.

In contrast to the previously described known method, in the inventive method for producing a chip module the arrangement of the chip on the carrier substrate is effected before the forming of the contact conductor arrangement on the one hand; on the other hand, the forming of the contact conductor arrangement is effected by structuring the carrier substrate formed from the contact material.

In accordance with the invention, cladding material is applied onto the carrier substrate before forming the contact conductor arrangement for forming a cladding material layer encasing the chip. Thus not only a housing for the chip is formed. In fact, simultaneously with forming the housing for the chip, a mechanical stabilization of the carrier substrate is achieved, thus making possible the subsequent forming of the contact conductor arrangement by structuring of the contact material of the carrier substrate without mechanical supporting means for the carrier substrate being required.

In accordance with the invention the cladding material layer, starting from its upper side, is provided with at least one contact recess, said contact recess exposing the contact material of the carrier substrate for forming a contact surface on the contact material layer of the carrier substrate, such that a through-connection of the cladding material layer with direct contact to the contact conductor arrangement of the carrier substrate is produced.

In accordance with the invention the contact recess is backfilled with contact material for forming a through-connection formed as a contact column.

In accordance with the invention the cladding material layer is treated by material abrasion, starting from its upper side, for exposing a rear side of the chip, in such a way that the rear side of the chip and the contact column are aligned flush in a cladding material surface produced by said treatment.

In accordance with the invention a contact material layer is applied onto the rear side of the chip as well as onto the surface of the cladding material layer and the contact column, in order to connect the rear side of the chip with the contact conductor arrangement located on the front side of the chip in an electrically conductive manner so as to make the rear side of the chip utilizable as a terminal face for an electrical field.

Simultaneously or alternatively, a dissipation of process heat can be effected via the contact material layer from the rear side of the chip towards the contact conductor arrangement, making the inventive method particularly suitable for the production of power modules.

In accordance with the invention the contact material layer is structured to form a contact conductor arrangement on the rear side of the chip.

Deviating from the forming of a contact metallization on a surface of the cladding material layer previously treated by material abrasion, in accordance with the invention the contact metallization is applied onto the surface of the cladding material layer even before the forming of the contact recesses in the cladding material layer, and subsequently a contact material is applied to the contact metallization and is structured for the forming of a contact conductor arrangement on the rear side of the chip.

Based on such a structuring of the contact material layer, in accordance with the invention the cladding material layer, starting from its upper side, is provided with at least one contact recess for forming a through-connection in the cladding material layer, said contact recess exposing the contact material in order to form a contact surface on the contact material layer of the carrier substrate, and subsequently the contact recess is backfilled with a contact column made of contact material in order to form the through-connection.

In order to contact the rear side of a chip, in accordance with the invention it is envisaged that the rear side of the chip is initially exposed via an application of laser radiation to the cladding material, and subsequently a deposition of a contact material on the rear side of the chip is effected in order to produce a contact between the rear side of the chip and the contact layer on the rear side of the chip.

Preferably, the securing of the chip on the carrier substrate is effected by the chip being placed on an adhesive coating of the contact material layer of the carrier substrate with its front side provided with chip terminal faces. Due to the adhesive coating of the carrier substrate, providing recesses or the like in the carrier substrate which define the position of the chip on the carrier substrate is not required, for example. Thereby the carrier substrate can be formed particularly simply with flat surfaces.

It is particularly advantageous if the carrier substrate is made out of a contact material foil which allows for a particularly thin embodiment of the carrier substrate made of contact material. Moreover, the contact material foil for the forming of the carrier substrate can be provided as a continuous material, by which means an automated inline production of the chip module in large quantities is facilitated, since the contact material foil can be simultaneously used as a continuous conveyor for a clocked forward motion in the production process of the chip module.

It is particularly advantageous if a contact material foil for the carrier substrate is used which is already provided with an adhesive coating, making an application of an adhesive coating in a separate process step before equipping the carrier substrate with the chip unnecessary.

If contact recesses are formed by the structuring of the carrier substrate in superposition with the chip terminal faces, said contact recesses being backfilled with contact material for contacting the chip terminal faces with the contact conductor arrangement, the forming of connection contacts, which establish an electrically conducting connection between the contact conductor arrangement and the chip terminal faces, can be effected particularly easily.

The connection contacts can be formed, for example, by using solder material as a contact material, said solder material being applied into the contact recesses. Such an application of solder material can, for example, be effected by a method in which fused solder material deposits are flung onto the chip terminal faces made accessible by the contact recesses.

Another possibility of introducing contact material into the contact recesses is to introduce the contact material into the contact recesses by means of a deposition process, in which generally a galvanic deposition process as well as a currentless deposition process may be employed, whereby the introduction of contact material is preferably effected by autocatalytic deposition, i.e. by depositing nickel and/or gold, for example. To improve the adhesiveness between the autocatalytically deposited metals and the chip terminal faces, an electrolytic application of zincate or palladium to the chip terminal faces can advantageously be effected, in order to carry out a "seeding" of the chip terminal faces.

As an alternative to the contacting of the chip terminal faces with the carrier substrate by the forming of contact recesses in the contact material layer by structuring of the contact material layer and the backfilling of the contact recesses with contact material, a contacting of the chip terminal faces with the contact material layer can also be effected independently from the structuring of the contact material layer before the forming of the contact conductor arrangement.

Preferably, for contacting the chip terminal faces with the contact material layer, the chip terminal faces provided with contact elevations are brought into abutment with the contact material layer, and subsequently the connection of the chip terminal faces with the contact material layer is effected by means of fusing the contact elevations. Thereby the securing of the chip on the carrier substrate can be effected simultaneously with forming the connection contact to the contact material layer.

It is particularly advantageous if the fusing of the contact elevations is effected by means of an application of laser radiation to the chip or to the contact material layer.

Especially when the cladding material is applied as a cladding material layer onto the chip in such a way that the chip is sandwiched between the cladding material layer and the carrier substrate, and the cladding material layer is subsequently connected to the carrier substrate in a lamination process to form a laminate structure comprising the carrier substrate, the cladding material layer acts as a supporting means stiffening the carrier substrate, such that even in the event of the carrier substrate being formed as a foil material, processing of the carrier substrate for structuring the contact material layer can still be effected, without the flexibility of the carrier substrate hampering the processing.

In the following, different variants of the method for producing a chip module are explained in reference to the drawing.

In the figures

FIGS. 22 and 23 show the forming of a connection contact between chips and a carrier substrate via contact elevations;

FIG. 24 shows the laminate structure of a chip module before the structuring of a contact material layer;

FIG. 25 shows the structuring of the contact material layer for forming the chip module;

FIG. 26 shows the laminate structure of a chip module before the structuring of the contact material layer;

FIG. 27 shows the structuring of the contact material layer for forming the chip module.

Figure 1:
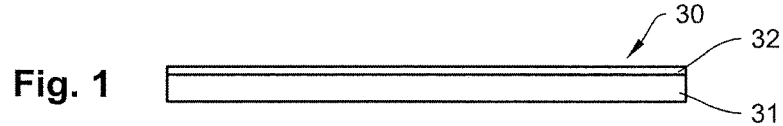
FIGS. 1 through 13 show the production of a chip module according to a first embodiment of the method in consecutive production steps.

FIG. 1 shows as the starting point of the implementation of the method the provision of a carrier substrate 30 with a metallic foil made of a contact material 31, which is formed as a copper foil in this case. The carrier substrate 30 is provided with an adhesive coating 32, which can be formed as a thermally activatable epoxy resin, for example. It is also conceivable that, irrespective of any activation, the coating is formed as an adhesive layer which for easy handling and provision of the carrier foil is provided with peel-off paper or something similar, so that the carrier foil can also be available as rolls, i.e. rolled up.

Figure 2:
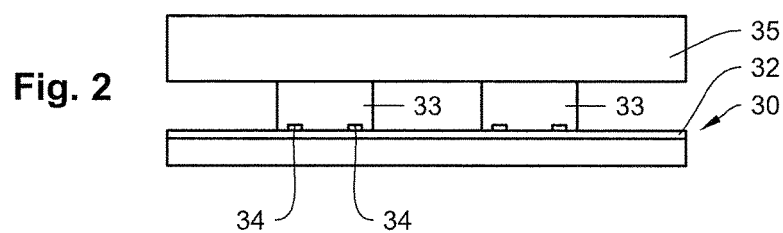

As displayed in FIG. 2, at the start of the method an arranging of at least one, in this case several chips 33, takes place, said chips being arranged on the carrier substrate 30 with their chip terminal faces 34 facing down, and a positioning of the chips 33 in order to secure them on the carrier substrate 30 taking place by means of the adhesive coating 32.

Following this, a cladding material layer 35, preferably consisting of a material mixture mainly comprising an epoxy resin, is placed on the chips 33 in such a way that the chips 33 are now sandwiched between the carrier substrate 30 and the cladding material layer 35. In the following lamination step, the cladding material layer 35 is brought into abutment with the carrier substrate 30 under the dual impact of thermal energy and pressure, whereby the material of the cladding material layer 35 is displaced by the chips 33, with the result that, as displayed in FIG. 3, after the termination of the lamination step, the chips 33 are embedded in the cladding material layer 35 in such way that in particular the rear sides 36 of the chips 33 are covered by the material of the cladding material layer 35. In its composition, the material of the cladding material layer 35 is chosen so that the thermal expansion coefficient of the cladding material is as close as possible to the thermal expansion coefficient of the contact material 31 of the carrier substrate 30. This can be achieved, for example, by adding a sufficient amount of silicon oxide as a filling agent to the epoxy base of the cladding material, whereby a thermal expansion coefficient, for example, in the range of 7 to 8 $K^{-1}$ can be reached, which is not too far spaced from the thermal expansion coefficient of copper, which is preferably used as a main component for the contact material 31 and has a thermal expansion coefficient of about 16 $K^{-1}$. This means that after the hardening of the cladding material layer 35 a delamination of the cladding material layer 35 and the carrier substrate 30 need not be reckoned with. Instead, the remaining flexibility of the cladding material 35 after the hardening is sufficient to compensate the differences between the thermal expansion coefficients.

By securing the chips 33 during the lamination process, said securing being effected in this case via the adhesive coating 32, it is prevented that the chips 33 change position on the carrier substrate 30 during the hardening of the cladding material 35.

Figure 4:
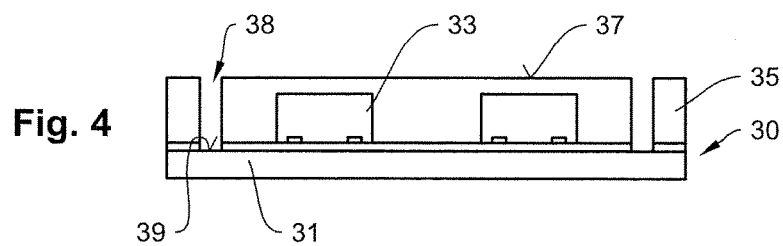

As shown in FIG. 4, after the hardening of the material of the cladding material layer 35, contact recesses 38 in the cladding material layer 35 are formed starting from an upper side 37 of the cladding material layer 35, said contact recesses 38 exposing the contact material 31 of the carrier substrate 30 in order to form an inner contact surface 39. Preferably, the forming of the contact recesses 38 can be effected by means of applying laser radiation to the upper side 37 of the cladding material layer 35.

Figure 5:
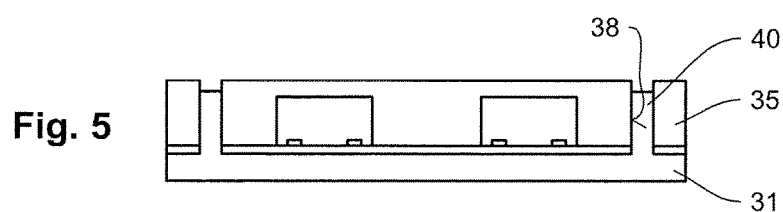

Subsequently, as shown in FIG. 5, the backfilling of the contact recesses 38 with a contact material 40 is effected, which contact material can be deposited autocatalytically on the contact surfaces 39, for example, whereby, preferably before the deposition of the contact material 40 on the contact surface 39, a seeding of the contact surfaces 39 with, for example, zincate or palladium can be effected in order to improve the adhesion between the contact material 40 deposited on contact surface 39 and the contact surface 39. A material composition is chosen as a contact material 40 which preferably coincides with the contact material 31 and at least predominantly comprises copper.

Figure 6:
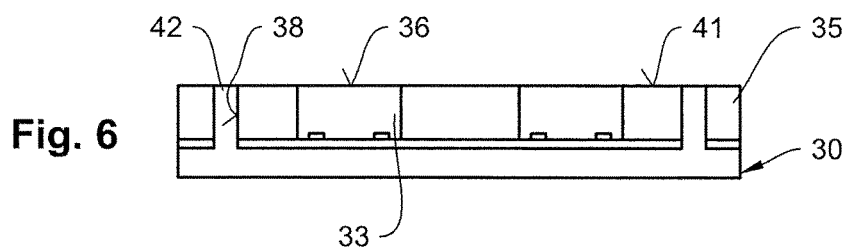

Subsequently, as shown in FIG. 6, a material abrasion treatment of the cladding material layer 35 is effected, with the result that in the thus produced cladding material surface 41 the surfaces of contact material columns 42 formed by the contact material 40 in the contact recesses 38 as well as the rear sides 36 of the chips are aligned flush in the cladding material surface 41. Thereby a thinning of the chips 33, i.e. a reduction of the height of the chips 33, can be effected simultaneously.

Figure 7:
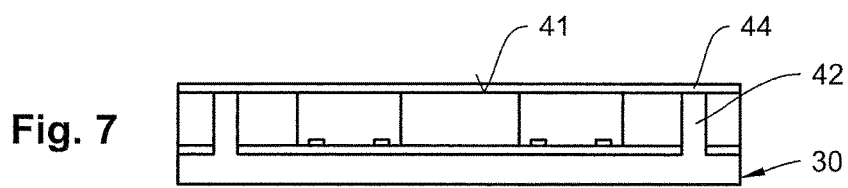
Figure 8:
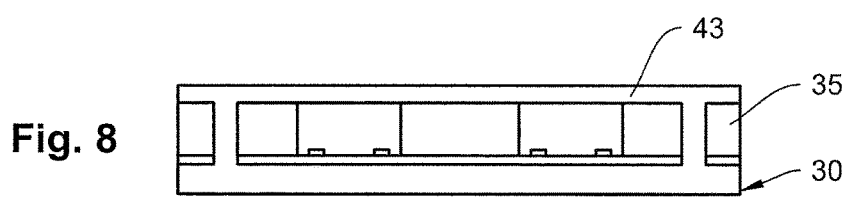

In a subsequent step of the method, preferably after the forming of a base metallization 44 on the cladding material surface 41, as shown in FIG. 7, has taken place, the forming of a contact material layer 43 on the cladding material layer 35 is effected, as shown in FIG. 8, whereby preferably copper or a copper alloy is chosen as a contact material for the contact material layer 43. The forming of the intermediate metallization 44 can be effected, for example, by a deposition of the material of the base metallization 44 on the cladding material surface 42, for example by sputtering a titanium/copper alloy. On the base metallization 44, the contact material layer 43 can be applied subsequently by deposition, whereby the deposition can be effected either galvanically or else autocatalytically.

Figure 9:
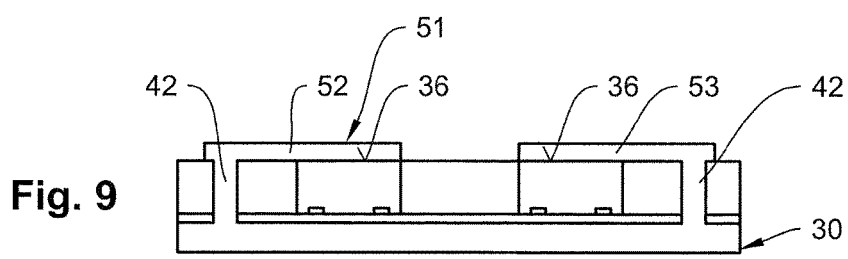

In order to form a contact conductor arrangement 51 on the rear side of a chip as shown in FIG. 9, a lithographic structuring of the contact material layer 43 placed on the cladding material layer 35 is effected preferably in such a way that the contact conductor arrangement 51 on the rear side of the chip in this case exhibits two contact conductors 52, 53 which each connect a rear side 36 of the chip with a contact column 42.

Figure 10:
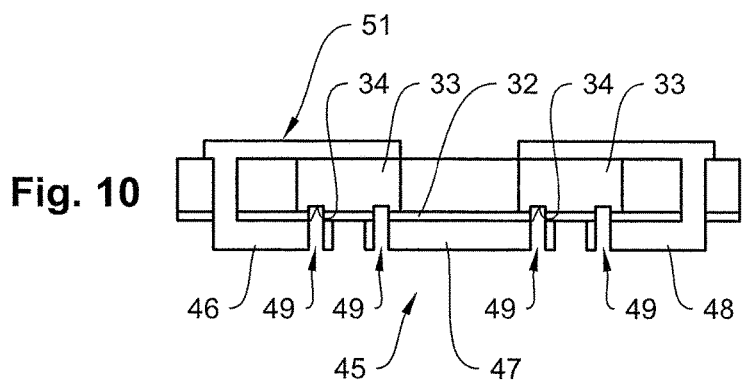
Figure 11:
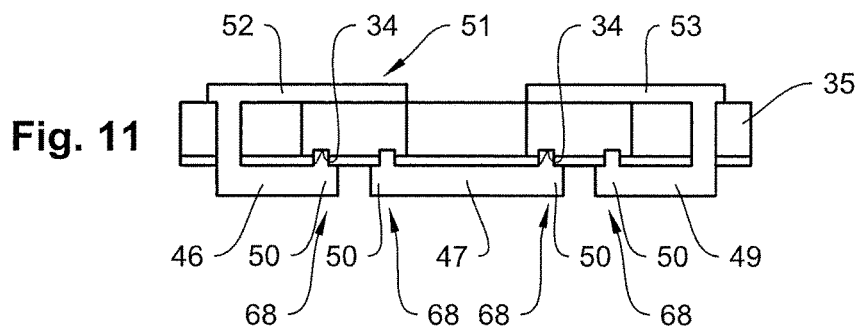
Figure 12:
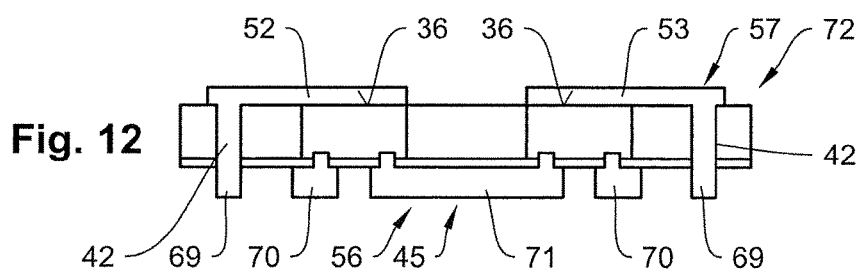

In order to form a contact conductor arrangement 45, produced via a structuring of the carrier substrate 30 and shown in FIG. 12, initially a processing of the carrier substrate 30 is effected, as is illustrated in the sequence of FIGS. 10 and 11, in a first lithographic step of the method, so as to form contact conductors 46, 47, 48 on the one hand and contact recesses 49 in the carrier substrate 30 on the other hand. Preferably, in addition to the lithographic method, after the removal of the contact material 31 of the carrier substrate 30 for forming the contact recesses 49, an application of laser radiation to the chip terminal faces 34 is effected in order to clean the surface of said chip terminal faces 34, especially in order to remove all possible residues of the adhesive coating 32. The forming of connection contacts 68 which connect the contact conductors 46, 47, 48 to the chip terminal faces 34 is then effected preferably by means of autocatalytic deposition of a contact material 50 which consists preferably of copper or a copper alloy, and which furthermore is preferably deposited in a currentless manner on the chip terminal faces 34 previously seeded with zincate or palladium.

Based on the contact conductors 46, 47, 48 shown in FIG. 11 and formed in the first lithographic step of the method, the completion of the contact conductor arrangement 45 shown in FIG. 12 and thus the forming of a chip module 72 produced on the basis of the carrier substrate 30 shown in FIG. 1 is effected in a second lithographic step of the method, in which terminal contacts 69, 70 and 71 are formed from the contact conductors 46 and 48. Thus the terminal contacts 69 allow a contacting of the rear sides 36 of the chips via the contact columns 42 and the contact conductors 52 and 53, respectively, and the terminal contacts 70, 71 allow a contacting of the chip terminal faces 34.

Figure 13:
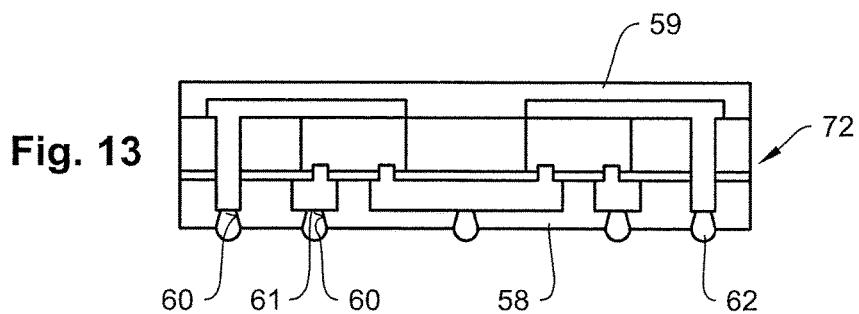
Figure 14:
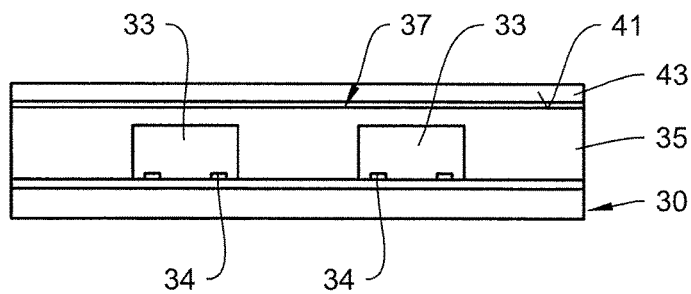
FIGS. 14 through 21 show the production of a chip module according to a variant of the method in different consecutive production steps.

As a synopsis of FIGS. 12 and 13 shows, a terminal contact side 56 as well as a rear side 57 of the chip module 72 is provided with a passivation 58, 59 preferably composed of an epoxy resin, whereby contact recesses 60 are formed in the passivation 58 of the outer contact side 56, said contact recesses exposing contact surfaces 61, making the application of solder bumps 62 onto the contact surfaces 61 possible, said solder bumps forming contact points for any possible outer contacting of the chip module 72.

Figure 3:
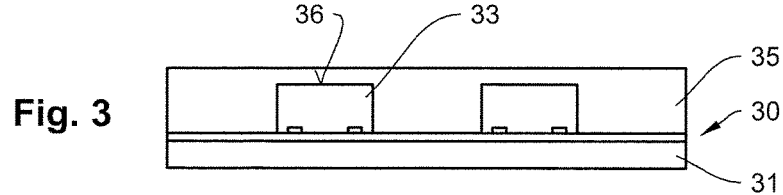

A variant of the method is shown in the sequence of FIGS. 14 through 21, based on the state of the process illustrated in FIG. 3, i.e. after the positioning and securing of the chips 33 with their contact sides provided with the chip terminal faces 34 on the carrier substrate 30, in which the upper side 37 of the cladding material layer 35 is provided with the contact material layer 43, without a material abrasion treatment of the cladding material surface 41 having previously been effected, as shown in FIG. 6.

Figure 15:
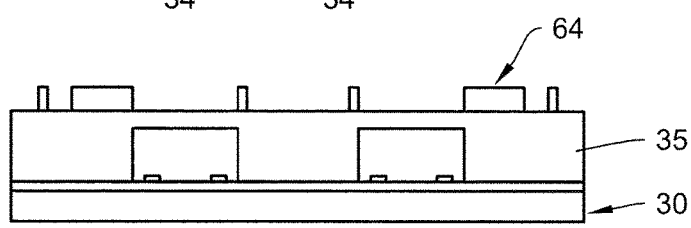
Figure 16:
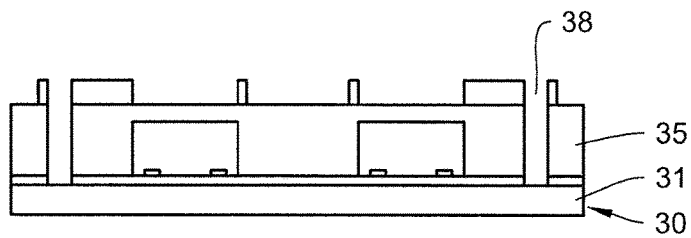
Figure 17:
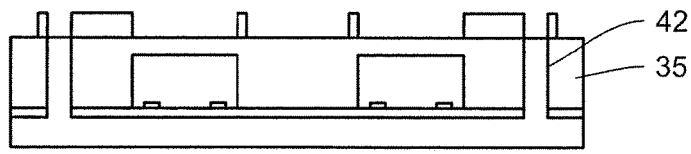

As shown in FIG. 15, for forming a contact conductor arrangement 62 on the rear side of the chip, shown in FIG. 19, the forming of a contact structure 63 on the cladding material layer 35 is subsequently carried out in a first step, preferably by employing a lithographic method, and subsequently, as shown in FIG. 16, the forming of contact recesses 64 in the cladding material layer 35 is carried out, said recesses exposing the contact material 31 of the carrier substrate 30 in the area of the contact surfaces 39, so as to enable the forming of contact columns 42 in the cladding material layer 35, as shown in FIG. 17 and as already described in reference to FIGS. 4 and 5.

Figure 18:
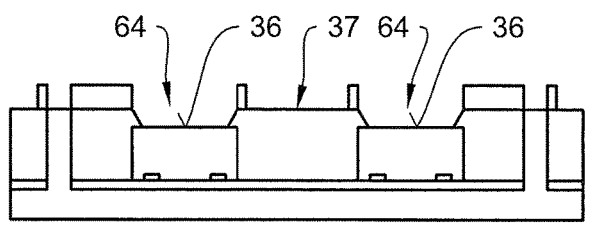
Figure 19:
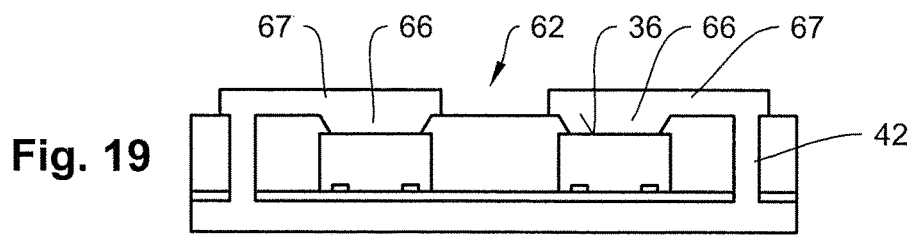

After the exposing of the rear sides 36 of the chips as shown in FIG. 18, for example by application of laser radiation to the upper side 37 of the cladding material layer 35, contact recesses 64 formed in the cladding material layer 35 on the rear sides 36 of the chips and contact surfaces 65 of the contact columns 42 are preferably provided with a contact material 66 by means of currentless deposition of copper or a copper alloy; the contact material 66 forming contact conductors 67 in connection with the contact structure 63 previously formed by structuring the contact material layer 43, said contact conductors each connecting a rear side 36 of a chip with a contact column 41, as shown in FIG. 19.

Figure 20:
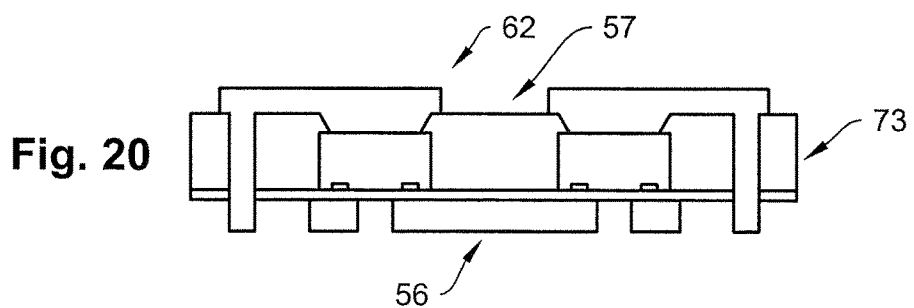

In order to form the contact conductor arrangement 45 from the carrier substrate 30, the structuring of the carrier substrate 30, as previously described in reference to FIGS. 10 through 12, is now carried out in order to form the chip module 73 shown in FIG. 20.

Figure 21:
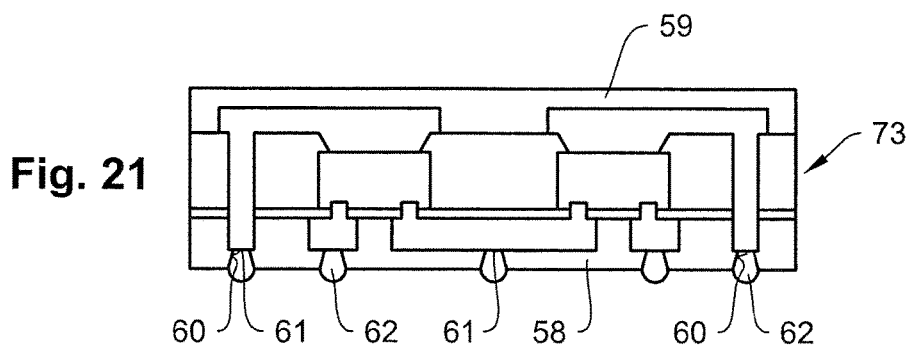

As a synopsis of FIGS. 20 and 21 shows, the terminal contact side 56 as well as a rear side 57 of the chip module 73 is subsequently provided with a passivation 58, 59 preferably composed of an epoxy resin, whereby contact recesses 60 are formed in the passivation 58 of the outer contact side 56, said recesses exposing contact surfaces 61, making the application of solder bumps 62 on the contact surfaces 61 possible, said solder bumps forming contact points for any outer contacting of the chip module 73.

FIGS. 22 and 23 show an alternative to the contacting of the chip terminal faces 34 with the carrier substrate 30 as shown in FIGS. 10 and 11, in which contact recesses 49 in the contact material layer 31 are formed by structuring of the contact material layer 31 and subsequent backfilling of the contact recesses 49 with a contact material 50. To this end, a contacting of the chip terminal faces 34 with a contact material layer 80 of a carrier substrate 81, which is provided with a non-conductive adhesive coating 82, is carried out even before the forming of the contact conductor arrangement 45 shown in FIGS. 25 and 27.

In the embodiment shown in FIGS. 22 and 23, the chip terminal faces 34 are provided with contact elevations 83 in preparation for the contacting of the chip terminal faces 34 with the contact material layer 80, said contact elevations 83 being brought into abutment with the contact material 80 and being subsequently connected with the contact material layer 80 by fusing. In the illustrated embodiment a securing of the chips 33 on the carrier substrate 81 is carried out by means of the adhesive coating 82 prior to effecting the connection.

For fusing of the contact elevations 83, laser radiation is applied to the contact material layer 80 or to the chips 33 from their rear sides.

After the production of the connection of the chips 33 with the carrier substrate 81 as shown in FIG. 23, the steps of the method relating to the production of the chip module 72, already explained in reference to FIGS. 3 through 9, and relating to the production of the chip module 73, already explained in reference to FIGS. 14 through 19, are carried out, so that a laminate structure 84 and 85, respectively, shown in FIG. 24 and FIG. 26, respectively, is produced on the basis of the carrier substrate 81.

Based on the laminate structures 84 and 85, which until that point exhibit a yet unstructured contact material layer 80 of the carrier substrate 81, a structuring of the contact material layer 80, as shown in FIGS. 25 and 27, is now carried out to form the contact conductor arrangement 45, in such a way that for defining the terminal contacts 69, 70, 71 contact recesses 86, 87, 88 are formed in the contact material layer 80 preferably by a photolithographic method or laser ablation.

The thus produced chip modules 89, 90, like the chip modules 72 and 73 shown in FIGS. 13 and 21, can be provided on their contact side 56 as well as on their rear side 57 with a passivation 58, 59 preferably formed from an epoxy resin, whereby contact recesses 60 are formed in the passivation 58 of the outer contact side 56, said contact recesses exposing contact surfaces 61, so that solder bumps 62 can be applied to the contact surfaces 61, said solder bumps forming contact points for any possible outer contacting of the chip modules 89, 90.

The invention claimed is:

1. A method for producing a chip module having a carrier substrate consisting of a contact material layer and at least one chip arranged on the carrier substrate, as well as a contact conductor arrangement for connecting chip terminal faces with terminal contacts arranged on a contact side of the chip module, in which method the chip is secured on the carrier substrate with its front side provided with the chip terminal faces and subsequently the forming of the contact conductor arrangement is effected by means of a structuring of the contact material layer of the carrier substrate, wherein before the forming of the contact conductor arrangement for forming a cladding material layer encasing the chip, a cladding material is applied onto the carrier substrate, the cladding material layer is provided with at least one contact recess, starting from its upper side, said contact recess exposing the contact material for forming a contact surface on the contact material layer of the carrier substrate, the contact recess is backfilled with contact material for forming a contact column, and the cladding material layer is treated by material abrasion, starting from its upper side, for exposing a rear side of the chip, in such a way that the rear side of the chip and the contact column are aligned flush in a cladding material surface produced by said treatment, a contact material layer is applied onto the rear side of the chip and onto the cladding material surface, and the contact material layer is structured for forming a contact conductor arrangement on the rear side of the chip.

2. The method according to claim 1, wherein the securing of the chip on the carrier substrate is effected with an adhesive coating of the contact material layer of the carrier substrate.

3. The method according to claim 2, wherein the carrier substrate is formed from a contact material foil provided with the adhesive coating.

4. The method according to claim 1, wherein the contact recesses are formed by structuring of the contact material layer of the carrier substrate in superposition with the chip terminal faces, said contact recesses being backfilled with contact material for contacting the chip terminal faces with the contact conductor arrangement.

5. The method according to claim 4, wherein a solder material is used as contact material.

6. The method according to claim 5, wherein the contact material is introduced into the contact recesses by a deposition process.

7. The method according to claim 1, wherein before the forming of the contact conductor arrangement a contacting of the chip terminal faces with the contact material layer is effected.

8. The method according to claim 7, wherein for contacting the chip terminal faces with the contact material layer, the chip terminal faces provided with contact elevations are brought into abutment with the contact material layer, and subsequently the connecting of the chip terminal faces with the contact material layer is effected by fusing of the contact elevations.

9. The method according to claim 8, wherein the fusing of the contact elevations is effected by an application of laser radiation to the chip or to the contact material layer.

10. The method according to claim 1, wherein the cladding material is placed on the chip as a cladding material layer, in such a way that the chip is sandwiched between the cladding material layer and the carrier substrate, and the cladding material layer is subsequently connected to the carrier substrate in a lamination process for forming a laminate structure comprising the carrier substrate.

11. The method according to claim 1, wherein the contact material layer is applied by deposition.

12. A method for producing a chip module having a carrier substrate consisting of a contact material layer provided with an adhesive coating and at least one chip arranged on the carrier substrate, as well as a contact conductor arrangement for connecting chip terminal faces with terminal contacts arranged on a contact side of the chip module, in which method the chip is secured on the carrier substrate with its front side provided with the chip terminal faces and subsequently the forming of the contact conductor arrangement is effected by means of a structuring of the contact material layer of the carrier substrate, wherein before the forming of the contact conductor arrangement for forming a cladding material layer encasing the chip, a cladding material is applied onto the carrier substrate, the cladding material layer is provided with at least one contact recess, starting from its upper side, said contact recess exposing the contact material for forming a contact surface on the contact material layer of the carrier substrate, the contact recess is backfilled with contact material for forming a contact column, and the cladding material layer is treated by material abrasion, starting from its upper side, for exposing a rear side of the chip, in such a way that the rear side of the chip and the contact column are aligned flush in a cladding material surface produced by said treatment, a contact material layer is applied onto the rear side of the chip and onto the cladding material surface, and the contact material layer is structured for forming a contact conductor arrangement on the rear side of the chip.

13. A method for producing a chip module having a carrier substrate consisting of a metallic foil made of a contact material provided with an adhesive coating and at least one chip arranged on the carrier substrate, as well as a contact conductor arrangement for connecting chip terminal faces with terminal contacts arranged on a contact side of the chip module, in which method the chip is secured on the carrier substrate with its front side provided with the chip terminal faces and subsequently the forming of the contact conductor arrangement is effected by means of a structuring of the contact material layer of the carrier substrate, wherein before the forming of the contact conductor arrangement for forming a cladding material layer encasing the chip, a cladding material is applied onto the carrier substrate, the cladding material layer is provided with at least one contact recess, starting from its upper side, said contact recess exposing the contact material for forming a contact surface on the contact material layer of the carrier substrate, the contact recess is backfilled with contact material for forming a contact column, and the cladding material layer is treated by material abrasion, starting from its upper side, for exposing a rear side of the chip, in such a way that the rear side of the chip and the contact column are aligned flush in a cladding material surface produced by said treatment, a contact material layer is applied onto the rear side of the chip and onto the cladding material surface, and the contact material layer is structured for forming a contact conductor arrangement on the rear side of the chip.

\* \* \* \* \*